US009961807B2

(12) United States Patent
Kawaguchi et al.

(10) Patent No.: US 9,961,807 B2
(45) Date of Patent: May 1, 2018

(54) ELECTRIC POWER CONVERTOR

(71) Applicant: DENSO CORPORATION, Kariya, Aichi-pref. (JP)

(72) Inventors: Yoshiki Kawaguchi, Kariya (JP); Akio Yokota, Kariya (JP); Kazuhiro Kosaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 14/976,455

(22) Filed: Dec. 21, 2015

(65) Prior Publication Data
US 2016/0219758 A1    Jul. 28, 2016

(30) Foreign Application Priority Data

Dec. 23, 2014 (JP) ................. 2014-259594

(51) Int. Cl.
*H05K 7/20* (2006.01)
*H01L 23/473* (2006.01)

(52) U.S. Cl.
CPC ....... *H05K 7/20927* (2013.01); *H01L 23/473* (2013.01); *H05K 7/20254* (2013.01); *H05K 7/20336* (2013.01)

(58) Field of Classification Search
CPC ... H01L 23/473; H01L 23/467; H01L 23/367; H01L 23/3672; H01L 23/3736; H01L 23/4012; H01L 23/46; F28D 15/0275; F28D 15/0266; H05K 7/20927; H05K 7/20254; H05K 7/20336; H05K 7/1432; H05K 1/0203
See application file for complete search history.

(56) References Cited

U.S. PATENT DOCUMENTS

| 7,106,588 | B2* | 9/2006 | Oberlin | H01L 23/427 257/714 |
| 2007/0039717 | A1* | 2/2007 | Inagaki | H01L 23/473 165/80.4 |
| 2008/0169093 | A1* | 7/2008 | Ohfune | F28D 7/1684 165/164 |
| 2011/0299243 | A1* | 12/2011 | Yamaura | H05K 7/20927 361/688 |

(Continued)

FOREIGN PATENT DOCUMENTS

JP    2014-082822 A    5/2014

*Primary Examiner* — Adam B Dravininkas
(74) *Attorney, Agent, or Firm* — Oliff PLC

(57) ABSTRACT

An electric power converter includes a semiconductor module with a built-in switching element, a cooler that cools the semiconductor module, and a metallic case provided with an internal space that accommodates the semiconductor module and the cooler. The case is formed by combining a first case member and a second case member. The case includes an outer fixing portion for connecting and fixing the first case member and the second case member on an outside of the internal space, an inner fixing portion for connecting and fixing the first case member and the second case member on an inside of the internal space. The case includes a partition wall that is formed continuously from the inner fixing portion and partitions the internal space. A heat-generating component disposed along a wall surface of the partition wall is accommodated in the internal space.

6 Claims, 6 Drawing Sheets

(56) References Cited

U.S. PATENT DOCUMENTS

| | | | | |
|---|---|---|---|---|
| 2012/0250252 A1* | 10/2012 | Iguchi | ................ | H05K 7/20927 361/689 |
| 2012/0300521 A1* | 11/2012 | Hida | .................. | H05K 7/20927 363/131 |
| 2013/0058068 A1* | 3/2013 | Funatsu | ............. | H05K 7/20927 361/820 |
| 2013/0070502 A1* | 3/2013 | Suzuki | .................. | H02M 7/003 363/131 |
| 2014/0284765 A1* | 9/2014 | Kiuchi | .................... | H01L 28/40 257/532 |
| 2015/0245535 A1 | 8/2015 | Fujita et al. | | |

* cited by examiner

ELECTRIC POWER CONVERTOR

CROSS-REFERENCE TO RELATED APPLICATION

This application is based on and claims the benefit of priority from earlier Japanese Patent Applications No. 2014-259594 filed Dec. 23, 2014, the description of which is incorporated herein by reference.

TECHNICAL FIELD

The present invention relates to an electric power converter of which heat-generating components are accommodated in an internal space inside a case.

BACKGROUND

For example, an electric power converter such as an inverter is mounted on an electric vehicle, a hybrid vehicle or the like. An electric power converter of which electronic components such as a semiconductor module is accommodated in a case is disclosed in JP-A-2014-82822 (Patent Document). In addition to the semiconductor module, heat-generating components such as a capacitor are accommodated in the case. Further, for the purpose of miniaturization of the entire vehicle and reduction of the cost, the electric power converter is mounted on a vehicle component such as a motor or transmission components.

However, since the electric power converter disclosed in the Patent Document is mounted on a motor or the like, the following problems occurs.

That is, since the electric power converter mentioned above receives vibration directly from the motor or the like, it is necessary to protect the electronic components inside the case from the vibration by improving the vibration resistance thereof.

Further, in the electric power converter mentioned above, the electronic components accommodated in the case receive heat from the motor or the like in addition to their internal heat production, there is also a problem that the electronic components easily become high temperature.

Furthermore, even when the electric power converter is not mounted on the motor or the like, in a vehicle-mount electric power converter, for example, improvements of vibration resistance and heat dissipation are important issues.

SUMMARY

An embodiment provides an electric power converter capable of improving vibration resistance and heat dissipation of heat-generating components inside a case.

An electric power converter in a first aspect includes a semiconductor module with a built-in switching element, a cooler that cools the semiconductor module, and a metallic case provided with an internal space that accommodates the semiconductor module and the cooler. The case is formed by combining a first case member and a second case member. The case includes an outer fixing portion for connecting and fixing the first case member and the second case member on an outside of the internal space, an inner fixing portion for connecting and fixing the first case member and the second case member on an inside of the internal space, and a partition wall that is formed continuously from the inner fixing portion and partitions the internal space. A heat-generating component disposed along a wall surface of the partition wall is accommodated in the internal space.

In the electric power converter, in addition to the outer fixing portion, the case has the inner fixing portion for connecting and fixing the first case member and the second case member on the inside of the internal space. Therefore, since it is possible also to fix the first case member and the second case member in the internal space of the case, it is possible to improve the rigidity of the case. As a result, it is possible to improve the vibration resistance of the electric power converter 1.

Further, the case has the partition wall that is formed continuously from the inner fixing portion and partitions the internal space. Furthermore, the heat-generating component disposed along a wall surface of the partition wall is accommodated in the internal space. Therefore, the heat of the heat-generating component can be dissipated to the outside of the case via the partition wall and the inner fixing portion, thus it is possible to improve the heat dissipation of the heat-generating component.

As described above, according to the embodiment, the electric power converter capable of improving vibration resistance and heat dissipation of heat-generating components inside the case can be provided.

DETAILED DESCRIPTION OF THE PREFERRED EMBODIMENTS

An electric power converter is mounted on an electric vehicle or a hybrid vehicle, for example, and is capable of performing power conversion between a DC power supply and a three-phase AC rotary electric machine as a means of driving of the vehicle.

EMBODIMENT

Embodiment 1

An embodiment of an electric power converter will be described with reference to FIGS. 1 to 6.

Figure 2:
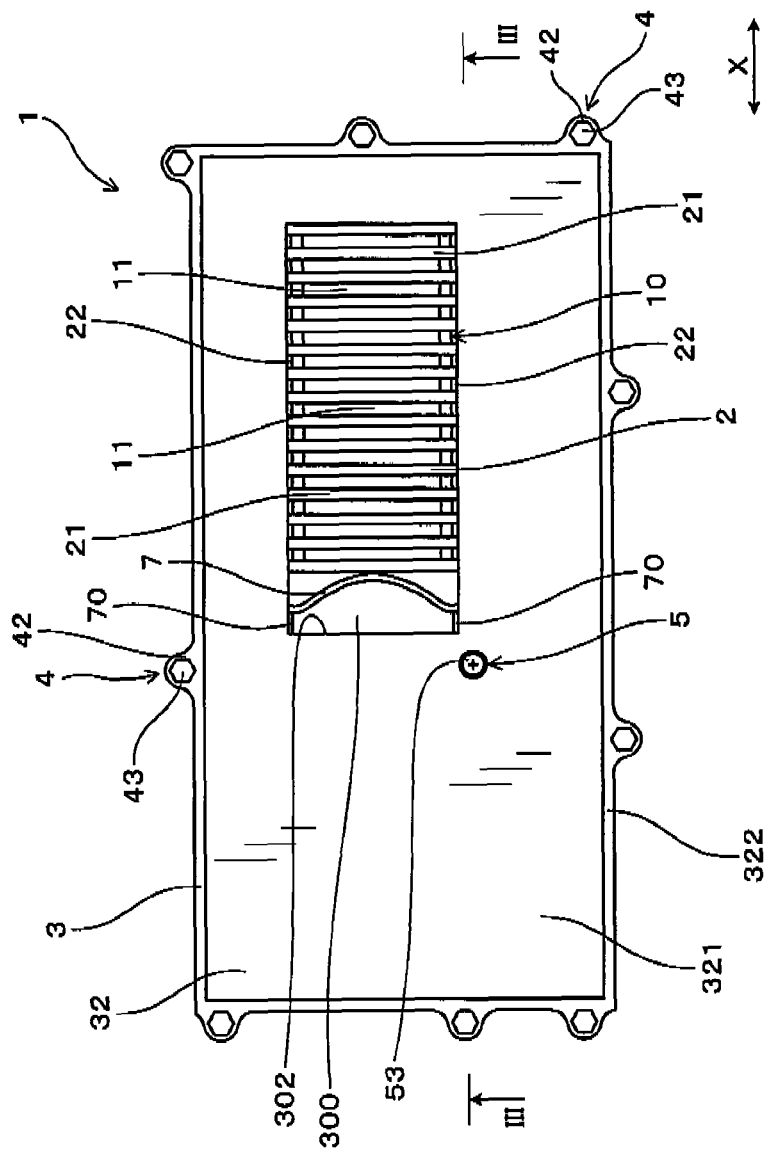
FIG. 2 shows a top view of the electric power converter in the embodiment 1.
Figure 3:
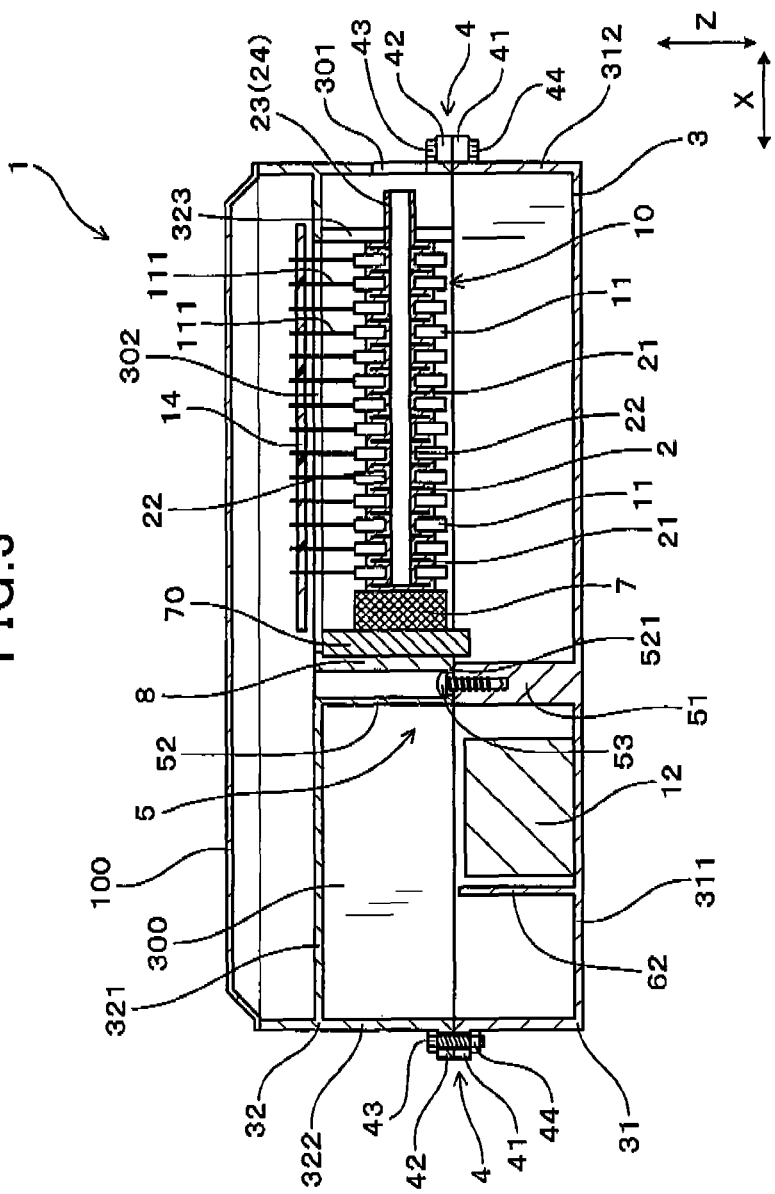
FIG. 3 shows a sectional view taken along a line III-III of FIG. 2.

As shown in FIGS. 2 and 3, an electric power converter 1 of the present embodiment includes semiconductor modules 11 with built-in switching elements, a cooler 2 that cools the semiconductor modules 11, and a metallic case 3 provided with an internal space 300 that accommodates the semiconductor modules 11 and the cooler 2.

Figure 1:
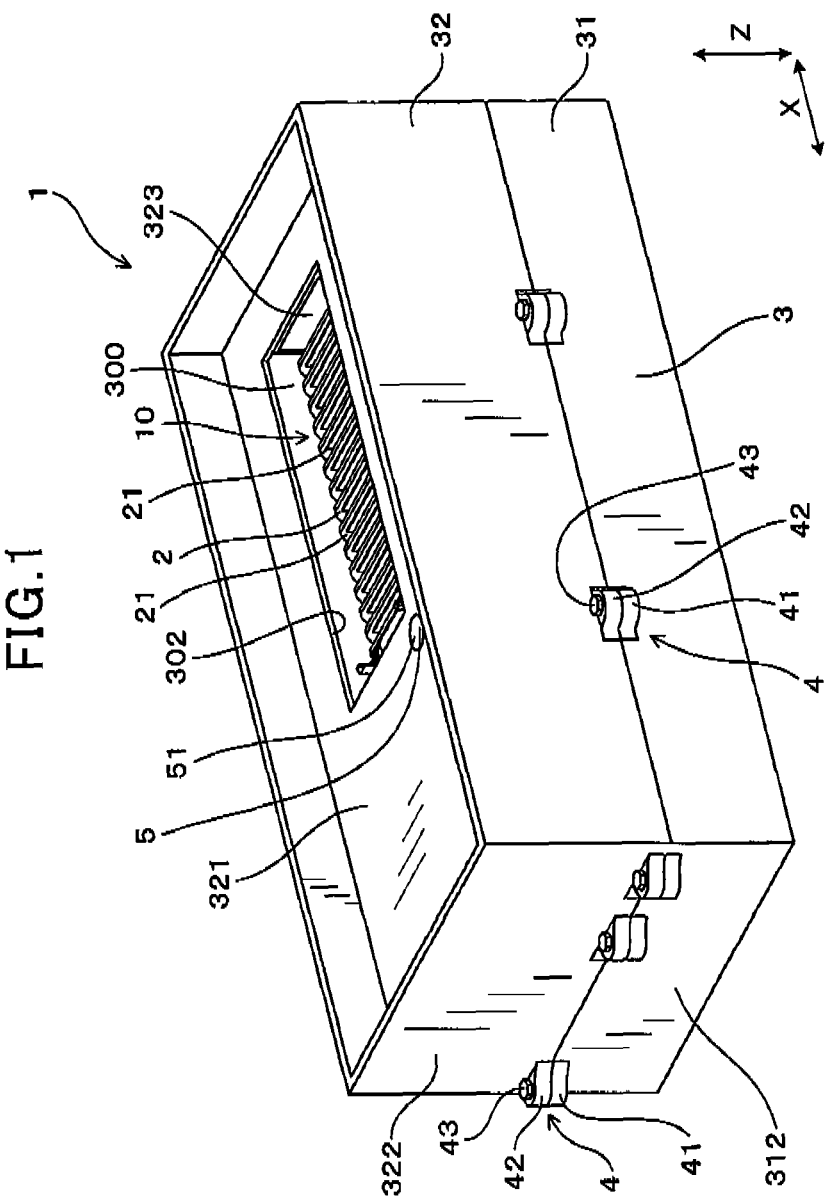
FIG. 1 shows a perspective view of an electric power converter in an embodiment 1.
Figure 4:
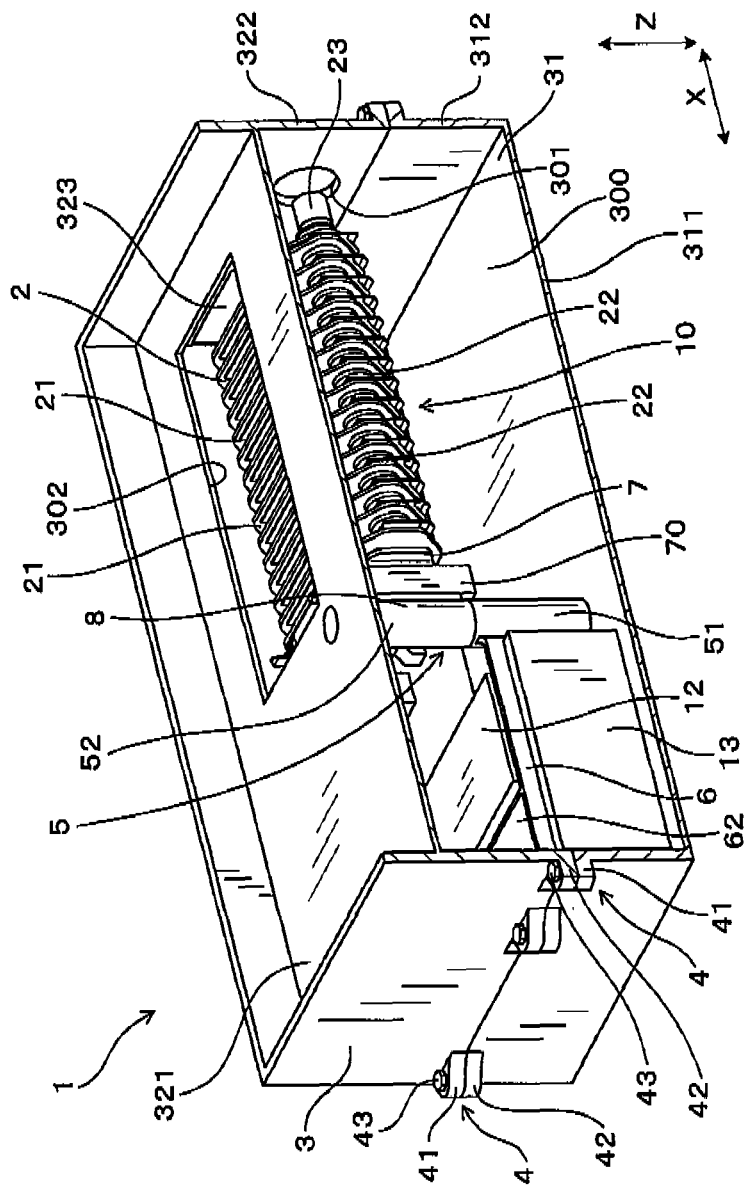
FIG. 4 shows a partial sectional perspective view of the electric power converter in the embodiment 1.
Figure 5:
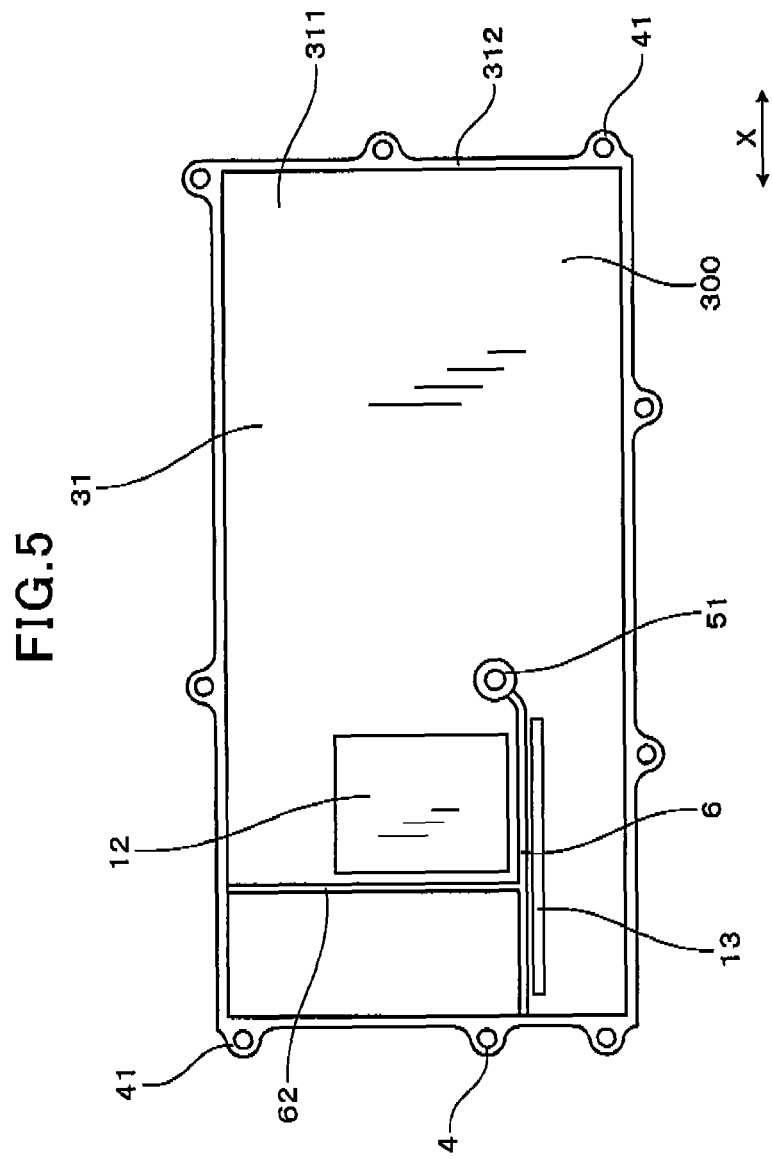
FIG. 5 shows a top view of a first case member and a component accommodated therein in the embodiment 1.

As shown in FIGS. 1 and 3, the case 3 is formed by combining a first case member 31 and a second case member 32. As shown in FIGS. 2 and 3, the case 3 includes outer fixing portions 4 for connecting and fixing the first case member 31 and the second case member 32 on an outside of the internal space 300, and an inner fixing portion 5 for connecting and fixing the first case member 31 and the second case member 32 on an inside of the internal space 300. Further, as shown in FIGS. 4 and 5, the case 3 has a partition wall 6 that is formed continuously from the inner fixing portion 5 and partitions the internal space 300. A heat-generating component 12 disposed along a wall surface of the partition wall 6 is accommodated in the internal space 300.

As shown in FIGS. 4 and 5, an electronic component 13 is disposed along a wall surface of the partition wall 6 opposite to a side on which the heat-generating component 12 is disposed is accommodated in the internal space 300. In the present embodiment, the heat-generating component 12 is a reactor, and the electronic component is a discharge resistor. The reactor 12 and the discharge resistor 13 are used appropriately in the following.

As shown in FIGS. 3 to 5, the first case member 31 has a substantially rectangular-shaped first bottom wall portion 311, and a substantially rectangular cylindrical first side wall portion 312 disposed extending toward one of normal directions of the first bottom wall portion 311 from edges of the first bottom wall portion 311. The first case member 31 opens toward a side opposite to the first bottom wall portion 311.

For convenience, hereinafter, the normal direction of the first bottom wall portion 311 is referred to as a vertical direction Z, and in the vertical direction Z, an opening side of the first case member 31 is referred to as an upper side, and an opposite side is referred to as a lower side.

Figure 6:
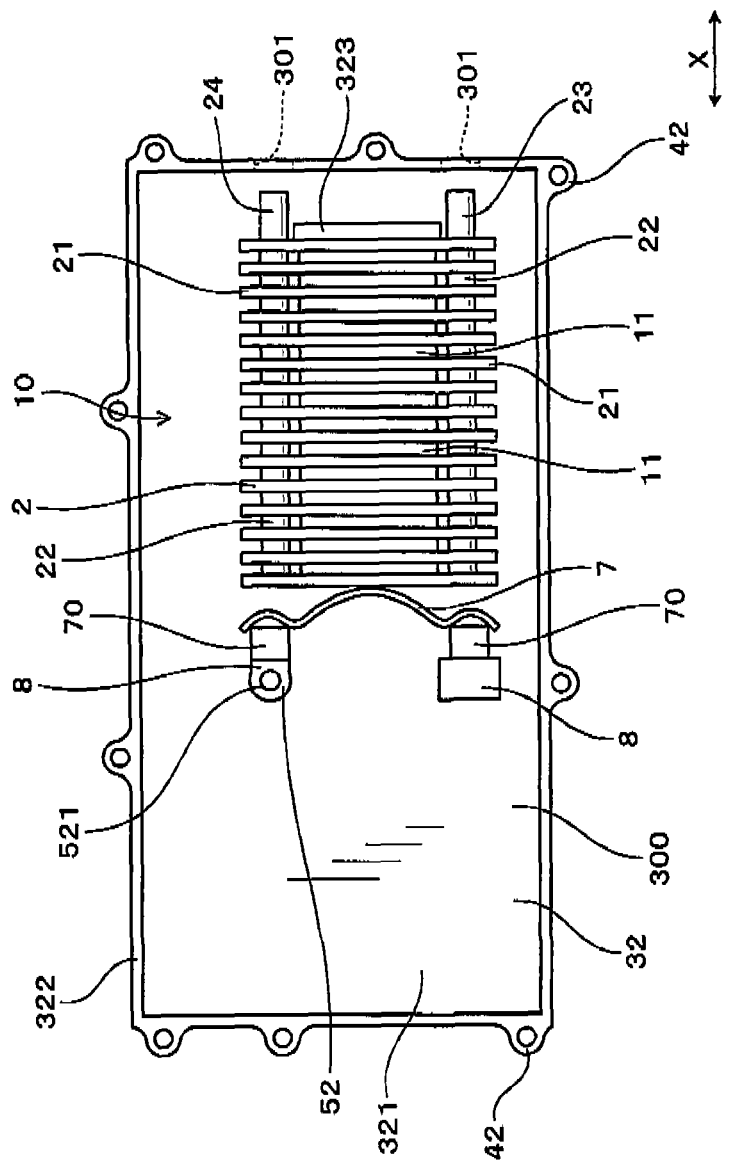
FIG. 6 shows a bottom view of a second case member and components accommodated therein in the embodiment 1.

As shown in FIGS. 3, 4, and 6, the second case member 32 has a substantially rectangular-shaped second bottom wall portion 321, and a substantially rectangular cylindrical second side wall portion 322 disposed extending in the vertical direction Z from edges of the second bottom wall portion 321. The second side wall portion 322 also protrudes above the second bottom wall portion 321. Then, upper and lower end portions of the second case member 32 open in the vertical direction Z.

As shown in FIGS. 1 and 3, the first case member 31 and the second case member 32 are stacked in the vertical direction Z such that an upper end of the first side wall portion 312 and a lower end of the second side wall portion 322 abut. A region surrounded by the first bottom wall portion 311, the first side wall portion 312, the second bottom wall portion 321, and the second side wall portion 322 is the internal space 300 of the case 3.

As shown in FIGS. 3 to 5, the inner fixing portion 5 is formed of a first boss portion 51 disposed on the first case member 31, a second boss portion 52 disposed on the second case member 32, and a bolt that fastens the first boss portion 51 and the second boss portion 52. The first boss portion 51 is disposed on the first bottom wall portion 311 towards the upper side. As shown in FIGS. 3 and 5, a female screw hole for screwing the bolt 53 is formed extending toward the lower side from an upper end surface of the first boss portion 51.

As shown in FIGS. 3, 4, and 6, the second boss portion 52 is disposed on the second bottom wall portion 321 toward the lower side. The second boss portion 52 is formed in a cylindrical shape, while an upper end thereof is opened to an upper surface side of the second bottom wall portion 321, and has a bottom portion 521 at a lower end thereof provided with a bolt insertion hole.

As shown in FIGS. 1 and 2, the first boss portion 51 and the second boss portion 52 are formed at positions overlapping in the vertical direction Z, and are in contact with each other in the vertical direction Z. Then, by inserting the bolt 53 into the bolt insertion hole of the bottom portion 521 of the second boss portion 52 and screwing into the female screw hole of the first boss portion 51, the first boss portion 51 and the second boss portion 52 are fastened, thus the inner fixing portion 5 is formed.

As shown in FIGS. 1 to 6, the outer fixing portions 4 are formed of first flange portions 41 disposed on the first case member 31, second flange portions 42 disposed on the second case member 32, and bolts 43 and nuts 44 for fastening the first flange portions 41 and the second flange portions 42. The first flange portions 41 are formed on an upper end portion of the first side wall portion 312 outwardly to the outside of the case 3, and the second flange portions 42 are formed on a lower end portion of the second side wall portion 322 outwardly to the outside of the case 3. Bolt insertion holes are formed in the first flange portions 41 and the second flange portions 42.

As shown in FIGS. 1 to 3, the first flange portions 41 and the second flange portions 42 are formed at positions overlapping in the vertical direction Z, and are in contact with each other in the vertical direction Z. Then, by inserting the bolts 43 into the bolt insertion hole of the first flange portions 41 and the bolt insertion holes of the second flange portions 42 and screwing into the nuts 104, the first flange portions 41 and the second flange portions 42 are fastened, thus the outer fixing portion 4 is formed. The outer fixing portions 4 are formed at a plurality of positions in the case 3.

As shown in FIGS. 3, 4, and 6, the semiconductor modules 11 and the cooler 2 are disposed in an inner region of the second case member 32 in the internal space 300. The cooler 2 has a plurality of cooling pipes 21. The plurality of cooling pipes 21 is stacked together with a plurality of semiconductor modules 11 to form a stacked structure 10. A pressing member 7 that presses the stacked structure 10 in the stacking direction X is disposed at one end in the stacking direction X of the stacked structure 10. The pressing member 7 is supported by the stacked structure 10 and supporting members 8 from an opposite side in the stacking direction X. At least a portion of the supporting members 8 is constituted by at least a part of the inner fixing portion 5.

The stacked structure 10 is disposed so as the stacking direction X matches a longitudinal direction of the second bottom wall portion 321. The stacked structure 10 is disposed on one side in the stacking direction X of the second boss portion 52.

Note that in the following, as appropriate, in the stacking direction X, a side on which the stacked structure 10 is disposed in the second boss portion 52 is referred to as a front, and an opposite side is referred to as a rear.

The semiconductor modules 11 in the stacked structure 10 have switching elements such as an IGBT (insulated gate bipolar transistor) and diodes such as an FWD (free wheel diode) built-in. Further, as shown in FIG. 3, the semiconductor modules 11 have control terminals 111 that protrude upwardly. Both main surfaces of each semiconductor module 11 are sandwiched by a pair of the cooling pipes 21. Note that the control terminals are not shown in the drawings other than FIG. 3.

As shown in FIGS. 4 and 6, the plurality of cooling pipes 21 are long in a direction perpendicular to the stacking direction X and the vertical direction Z, and at both ends in a longitudinal direction, adjoining cooling pipes 21 are connected to each other by deformable connecting pipes 22. As shown in FIGS. 3, 4, and 6, a front end surface of a cooling pipe 21 disposed at a front of the cooler 2 is in contact with a contacting portion 323 disposed downwardly from the second bottom wall portion 321. A refrigerant introduction pipe 23 for introducing a refrigerant and a refrigerant discharge pipe 24 for discharging the refrigerant are formed on the cooling pipe 21 disposed at the front of the cooler 2 so as to protrude toward the front. Through holes 301 for passing hoses or the like attached to the refrigerant introducing pipe 23 and the refrigerant discharge pipe 24 are formed on the case 3 in front of the refrigerant introduction pipe 23 and the refrigerant discharge pipe 24.

The refrigerant introduced from the refrigerant introduction pipe 23 passes through the connecting pipes 22 appropriately, and while being distributed to each cooling pipe 21, the refrigerant is distributed to each cooling pipe 21 in the longitudinal direction. Then, while flowing through each cooling pipe 21, the refrigerant exchanges heat with the semiconductor modules 11. The refrigerant of which the temperature has risen by the heat exchange passes through the downstream side connecting pipes 22, is guided to the refrigerant discharge pipe 24, and then is discharged from the cooler 2.

As shown in FIGS. 3, 4, and 6, in the stacking direction X, the pressing member 7 is disposed behind the cooler 2 and in front of the second boss portion 52. As shown in FIG. 6, the pressing member 7 is an elastically deformable plate spring in the present embodiment. The pressing member 7 is made of a heat transfer member, and is disposed in a compressed state in the stacking direction X. As shown in FIGS. 3 and 6, a front end of the pressing member 7 is in contact with a rear end surface of the cooler 2. Note that a contacting plate with high rigidity may be interposed between the pressing member 7 and the cooler 2.

As shown in FIGS. 3, 4, and 6, the pressing member 7 is in contact with the supporting members 8 via supporting pins 70 at both end portions in the longitudinal direction thereof. The supporting pins 70 are made of the heat transfer members. In the present embodiment, the second boss portion 52 of the second case member 32 becomes a supporting member 8 for supporting one of the longitudinal end portions of the pressing member 7. Thereby, the inner fixing portion 5 is in contact with the cooler 2 via the heat transfer member. In other words, the second boss portion 52 is in contact with the cooler 2 via the supporting pins 70 and the pressing member 7 which are heat transfer members.

As shown in FIG. 3, the control terminals 111 of the semiconductor modules 11 penetrate through an opening 302 formed in the second bottom wall portion 321, and are connected to a control circuit board 14 disposed on an upper side of the second bottom wall portion 321. The control circuit board 14 controls switching operations of the semiconductor modules 11. An upper end of the case 3 is covered by a lid 100. The lid 100 is fixed to the upper end of the case 3 by bolts (not shown). The control circuit board and the lid are not shown in the drawings other than FIG. 3.

As shown in FIGS. 4 and 5, the first case member 31 has the partition wall 6 that extends from the first boss portion 51. The partition wall 6 is extended from substantially the entire portion in the vertical direction Z of the first boss portion 51. Further, the partition wall 6 is disposed on the first bottom wall portion 311 towards the upper side.

As shown in FIG. 5, when viewed substantially linearly from above, the partition wall 6 extends substantially linearly from the first boss portion 51 toward the rear and is connected to a portion of the first side wall portion 312. Further, a branch wall 62 that extends in a direction perpendicular to the wall surface of the partition wall 6 is branched from a part of the partition wall 6. The branch wall 62 is also connected to the first side wall portion 312.

As shown in FIGS. 3 to 5, the reactor 12 and the discharge resistor 13 are disposed in an inner region of the first case member 31 in the internal space 300. The reactor 12 is disposed along the partition wall 6 and the branch wall 62. Further, a side surface of the reactor 12 is disposed opposing to the wall surface of the partition wall 6 and a wall surface of the branch wall 62. The discharge resistor 13 is disposed along the partition wall 6 so that a side surface of the discharge resistor 13 faces a wall surface on a side opposite to the reactor 12 side of the partition wall 6. In other words, the partition wall 6 is interposed between the reactor 12 and the discharge resistor 13.

The case 3 (including the inner fixing portion 5 and the partition wall 6) is made of the heat transfer member having thermal conductivity. Then, the reactor 12 is thermally connected to the cooler 2 via the partition wall 6, the branch wall 62, the first boss portion 51, the second boss portion 52, the supporting pins 70 and the pressing member 7. In addition, the discharge resistor 13 is thermally connected to the cooler 2 via the partition wall 6, the first boss portion 51, the second boss portion 52, supporting pins 70, and the pressing member 7.

Next, functions and effects of the present embodiment are described.

In the electric power converter 1, in addition to the outer fixing portion 4, the case 3 has the inner fixing portion 5 for connecting and fixing the first case member 31 and the second case member 32 on the inside of the internal space 300. Therefore, since it is possible also to fix the first case member 31 and the second case member 32 in the internal space 300 of the case 3, it is possible to improve the rigidity of the case 3. As a result, it is possible to improve the vibration resistance of the electric power converter 1.

Further, the case 3 has the partition wall 6 that is formed continuously from the inner fixing portion 5 and partitions the internal space 300. Further, the reactor 12 disposed along the wall surface of the partition wall 6 is accommodated in the internal space 300. Therefore, the heat of the reactor 12 can be dissipated to the outside of the case 3 via the partition wall 6 and the inner fixing portion 5, thus it is possible to improve the heat dissipation of the reactor 12.

Further, the discharge resistor 13 is disposed along the wall surface of the partition wall 6 opposite to the side on which the reactor 12 is disposed is accommodated in the internal space 300. Therefore, the heat of the reactor 12 can be suppressed from being transferred to the discharge resistor 13 which has low heat resistances. Thereby, it is possible to prevent problems from occurring in the discharge resistor 13 due to the heat of the reactor 12 being transmitted to the discharge resistor 13. Moreover, since the discharge resistor 13 generates the heat by itself, the heat resistance problems may easily occur when the heat from the reactor 12 is added. However, since the partition wall 6 can block the heat from the reactor 12, there is no need to use a discharge resistance with particularly high heat resistance. As a result, it is possible to miniaturize the size and reduce the cost of the discharge resistor 13.

Further, the inner fixing portion 5 is in contact with the cooler 2 via the heat transfer members (the supporting pins 70, the pressing member 7). Therefore, the heat of the reactor 12 can be dissipated to the cooler 2 via the partition wall 6, the inner fixing portion 5, and the heat transfer members (the supporting pins 70, the pressing member 7).

Further, at least the portion of the supporting members 8 is constituted by at least a part of the inner fixing portion 5. Therefore, the inner fixing portion 5 functions as a role of connecting the first case member 31 and the second case member 32, as well as functions as a role of supporting the stacked structure 10. Therefore, it is possible to reduce the number and the size of parts.

As described above, according to the present embodiment, the electric power converter capable of improving vibration resistance and heat dissipation of heat-generating components inside the case can be provided.

It should be noted that the shape and the structure of the fixing portion are not limited to those shown in the above embodiment, and various forms can be employed as long as it has a structure in which the first case member and the second case member are connected and fixed in the internal space.

Moreover, in the above embodiment, although an example is shown that the fixing portion is in contact with the cooler via the heat transfer members, the fixing portion may be in direct contact with the cooler.

Further, although the heat-generating component has been set to the reactor and the electronic component has been set to the discharging resistor in the above embodiment, they are not limited thereto.

Furthermore, the respective heat-generating component and the electronic component may be a single component, or may be a multiple component.

What is claimed is:

1. An electric power converter comprising:
a semiconductor module with a built-in switching element;
a cooler that cools the semiconductor module; and
a metallic case provided with an internal space that accommodates the semiconductor module and the cooler, wherein
the case is formed by combining a first case member and a second case member,
the case includes an outer fixing portion for connecting and fixing the first case member and the second case member on an outside of the internal space, an inner fixing portion for connecting and fixing the first case member and the second case member on an inside of the internal space, and a partition wall that is formed continuously from the inner fixing portion and partitions the internal space,
a heat-generating component disposed along a wall surface of the partition wall is accommodated in the internal space,
the cooler includes a plurality of cooling pipes,
the plurality of cooling pipes is stacked together with a plurality of semiconductor modules to form a stacked structure,
a pressing member that presses the stacked structure in a stacking direction is disposed at one end in the stacking direction of the stacked structure,
the pressing member is supported by the stacked structure and a supporting member from an opposite side in the stacking direction, and
at least a portion of the supporting member is constituted by at least a part of the inner fixing portion.

2. An electric power converter comprising:
a semiconductor module with a built-in switching element;
a cooler that cools the semiconductor module; and
a metallic case provided with an internal space that accommodates the semiconductor module and the cooler, wherein
the case is formed by combining a first case member and a second case member,
the case includes an outer fixing portion for connecting and fixing the first case member and the second case member on an outside of the internal space, an inner fixing portion for connecting and fixing the first case member and the second case member on an inside of the internal space, and a partition wall that is formed continuously from the inner fixing portion and partitions the internal space,
a heat-generating component disposed along a wall surface of the partition wall is accommodated in the internal space,
an electronic component is disposed along a wall surface of the partition wall opposite to a side on which the heat-generating component is disposed is accommodated in the internal space,
the cooler includes a plurality of cooling pipes,
the plurality of cooling pipes is stacked together with a plurality of semiconductor modules to form a stacked structure,
a pressing member that presses the stacked structure in a stacking direction is disposed at one end in the stacking direction of the stacked structure,
the pressing member is supported by the stacked structure and a supporting member from an opposite side in the stacking direction, and
at least a portion of the supporting member is constituted by at least a part of the inner fixing portion.

3. An electric power converter comprising:
a semiconductor module with a built-in switching element;
a cooler that cools the semiconductor module; and
a metallic case provided with an internal space that accommodates the semiconductor module and the cooler, wherein
the case is formed by combining a first case member and a second case member,
the case includes an outer fixing portion for connecting and fixing the first case member and the second case member on an outside of the internal space, an inner fixing portion for connecting and fixing the first case member and the second case member on an inside of the internal space, and a partition wall that is formed continuously from the inner fixing portion and partitions the internal space,
a heat-generating component disposed along a wall surface of the partition wall is accommodated in the internal space,
an electronic component is disposed along a wall surface of the partition wall opposite to a side on which the heat-generating component is disposed is accommodated in the internal space,
the heat-generating component is a reactor, and the electronic component is a discharge resistor,
the cooler includes a plurality of cooling pipes,
the plurality of cooling pipes is stacked together with a plurality of semiconductor modules to form a stacked structure,
a pressing member that presses the stacked structure in a stacking direction is disposed at one end in the stacking direction of the stacked structure, the pressing member is supported by the stacked structure and a supporting member from an opposite side in the stacking direction, and at least a portion of the supporting member is constituted by at least a part of the inner fixing portion.

4. An electric power converter comprising:

a semiconductor module with a built-in switching element;

a cooler that cools the semiconductor module; and a metallic case provided with an internal space that accommodates the semiconductor module and the cooler, wherein the case is formed by combining a first case member and a second case member, the case includes an outer fixing portion for connecting and fixing the first case member and the second case member on an outside of the internal space, an inner fixing portion for connecting and fixing the first case member and the second case member on an inside of the internal space, and a partition wall that is formed continuously from the inner fixing portion and partitions the internal space, a heat-generating component disposed along a wall surface of the partition wall is accommodated in the internal space, the inner fixing portion is in contact with the cooler via a heat transfer member, the cooler includes a plurality of cooling pipes, the plurality of cooling pipes is stacked together with a plurality of semiconductor modules to form a stacked structure, a pressing member that presses the stacked structure in a stacking direction is disposed at one end in the stacking direction of the stacked structure, the pressing member is supported by the stacked structure and a supporting member from an opposite side in the stacking direction, and at least a portion of the supporting member is constituted by at least a part of the inner fixing portion.

5. An electric power converter comprising:

a semiconductor module with a built-in switching element;

a cooler that cools the semiconductor module; and a metallic case provided with an internal space that accommodates the semiconductor module and the cooler, wherein the case is formed by combining a first case member and a second case member, the case includes an outer fixing portion for connecting and fixing the first case member and the second case member on an outside of the internal space, an inner fixing portion for connecting and fixing the first case member and the second case member on an inside of the internal space, and a partition wall that is formed continuously from the inner fixing portion and partitions the internal space, a heat-generating component disposed along a wall surface of the partition wall is accommodated in the internal space, an electronic component is disposed along a wall surface of the partition wall opposite to a side on which the heat-generating component is disposed is accommodated in the internal space, the inner fixing portion is in contact with the cooler via a heat transfer member, the cooler includes a plurality of cooling pipes, the plurality of cooling pipes is stacked together with a plurality of semiconductor modules to form a stacked structure, a pressing member that presses the stacked structure in a stacking direction is disposed at one end in the stacking direction of the stacked structure, the pressing member is supported by the stacked structure and a supporting member from an opposite side in the stacking direction, and at least a portion of the supporting member is constituted by at least a part of the inner fixing portion.

6. An electric power converter comprising:

a semiconductor module with a built-in switching element;

a cooler that cools the semiconductor module; and a metallic case provided with an internal space that accommodates the semiconductor module and the cooler, wherein the case is formed by combining a first case member and a second case member, the case includes an outer fixing portion for connecting and fixing the first case member and the second case member on an outside of the internal space, an inner fixing portion for connecting and fixing the first case member and the second case member on an inside of the internal space, and a partition wall that is formed continuously from the inner fixing portion and partitions the internal space, a heat-generating component disposed along a wall surface of the partition wall is accommodated in the internal space, an electronic component is disposed along a wall surface of the partition wall opposite to a side on which the heat-generating component is disposed is accommodated in the internal space, the heat-generating component is a reactor, and the electronic component is a discharge resistor, the inner fixing portion is in contact with the cooler via a heat transfer member, the cooler includes a plurality of cooling pipes, the plurality of cooling pipes is stacked together with a plurality of semiconductor modules to form a stacked structure, a pressing member that presses the stacked structure in a stacking direction is disposed at one end in the stacking direction of the stacked structure, the pressing member is supported by the stacked structure and a supporting member from an opposite side in the stacking direction, and at least a portion of the supporting member is constituted by at least a part of the inner fixing portion.

* * * * *